(12) United States Patent
Lin

(10) Patent No.: US 7,377,806 B1
(45) Date of Patent: May 27, 2008

(54) CIRCUIT BOARD HAVING AT LEAST ONE AUXILIARY SCRIBED LINE

(75) Inventor: Tsan-Yun Lin, Taipei County (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/675,443

(22) Filed: Feb. 15, 2007

(30) Foreign Application Priority Data

Nov. 30, 2006 (TW) .............................. 95144450 A

(51) Int. Cl.
 *H01R 27/00* (2006.01)
(52) U.S. Cl. ........................................ 439/516; 439/55
(58) Field of Classification Search ................ 439/516, 439/55, 67, 325, 951; 29/832
See application file for complete search history.

(56) References Cited

U.S. PATENT DOCUMENTS

| | | | | |
|---|---|---|---|---|
| 3,436,605 A | * | 4/1969 | Landron, Jr. ................. | 361/767 |
| 3,780,431 A | * | 12/1973 | Feeney ........................ | 29/830 |
| 5,031,073 A | * | 7/1991 | Chang ......................... | 361/778 |
| 5,131,140 A | * | 7/1992 | Zimmer ........................ | 29/846 |
| 6,370,766 B1 | * | 4/2002 | Degani et al. ................ | 29/832 |
| 6,774,957 B2 | * | 8/2004 | Jinno et al. .................... | 349/40 |
| 6,956,303 B1 | * | 10/2005 | Uebelein et al. ............ | 307/10.1 |

* cited by examiner

*Primary Examiner*—Michael C Zarroli
(74) *Attorney, Agent, or Firm*—J.C. Patents

(57) ABSTRACT

A circuit board including a board body, at least one first connector, and at least one second connector is provided. The board body has an edge and at least one auxiliary scribed line. The auxiliary scribed line is substantially parallel to the edge. The first connector is disposed on the board body and adjacent to the edge. The second connector is disposed on the board body and adjacent to the auxiliary scribed line. The second connector is electrically connected to the first connector. The first connector and the second connector are located on the different sides of the auxiliary scribed line.

4 Claims, 2 Drawing Sheets

CIRCUIT BOARD HAVING AT LEAST ONE AUXILIARY SCRIBED LINE

CROSS-REFERENCE TO RELATED APPLICATION

This application claims the priority benefit of Taiwan application serial no. 95144450, filed on Nov. 30, 2006. All disclosure of the Taiwan application is incorporated herein by reference.

BACKGROUND OF THE INVENTION

1. Field of the Invention

The present invention relates to a circuit board. More particularly, the present invention relates to a circuit board having at least one auxiliary scribed line.

2. Description of Related Art

Generally speaking, a conventional circuit board for carrying and electrically connecting a plurality of electronic components is mainly constituted of a plurality of wiring layers and a plurality of insulating layers which are stacked alternately. The wiring layers are formed of copper foils via a lithography/etching process, and the insulating layers are disposed between the adjacent wiring layers respectively, so as to isolate the wiring layers. Furthermore, the stacked wiring layers are electrically connected to one another through conductive vias. Additionally, various electronic components, such as active components or passive components, are further arranged on the surface of the circuit board, so as to achieve the purpose of electrical signal propagation through the circuits inside the circuit board.

In notebook computers, with different sizes (such as 14 inches, 15 inches, or 17 inches) of the displays of the notebook computers, the sizes of the mainboards arranged inside the mainframes of the notebook computers are also different. In the conventional art, manufacturers usually adopt different processes to meet different requirements on the sizes of the mainboards. However, the manufacturing cost is high if the mainboards with different sizes are manufactured through different processes.

In addition to the aforementioned conventional art, another conventional art is further provided. FIG. 1 is a schematic view of a conventional mainboard. Referring to FIG. 1, the conventional mainboard 100 is applicable to a notebook computer having a 14-inch display. When the conventional mainboard 100 is applied in a notebook computer having a 15-inch display, a plurality of connectors 110 on the mainboard 100 cannot meet the design of the internal space of the mainframe (not shown), so the connectors 110 cannot be exposed outside the mainframe. Therefore, the mainboard 100 must be electrically connected to a medium circuit board 10.

In particular, the medium circuit board 10 has a plurality of connectors 12. The connectors 110 on the mainboard 100 are electrically connected to the connectors 12 of the medium circuit board 10 through a connection cable 120. The connectors 12 are partially exposed outside the mainframe to connect peripheral equipments. However, the medium circuit board 10 and the connection cable 120 causes an increase of the cost and occupies the internal space of the mainframes, and also more working hours must be spent in assembling the medium circuit board 10 and the connection cable 120.

SUMMARY OF THE INVENTION

Accordingly, the present invention is directed to providing a circuit board which is applicable to notebook computers with different sizes.

The circuit board provided by the present invention comprises a board body, at least one first connector, and at least one second connector. The board has an edge and at least one auxiliary scribed line. The auxiliary scribed line is substantially parallel to the edge. The first connector is disposed on the board body and adjacent to the edge. The second connector is disposed on the board body and adjacent to the auxiliary scribed line. The second connector is electrically connected to the first connector. The first connector and the second connector are located on the different sides of the auxiliary scribed line.

In an embodiment of the present invention, the board body may have a connection circuit and the second connector is electrically connected to the first connector through the connection circuit. Furthermore, the connection circuit may have a plurality of connection wires, and the interval between every adjacent two of the connection wires may be larger than or equal to 1 mm.

In an embodiment of the present invention, the board body may have at least one single wiring layer area. Two opposite borders of the single wiring layer area maintain a first interval and a second interval with the auxiliary scribed line respectively, such that the single wiring layer area covers the auxiliary scribed line. Furthermore, the first interval may be larger than or equal to 3 mm and less than or equal to 4 mm. Additionally, the second interval may be larger than or equal to 3 mm and less than or equal to 4 mm.

In view of the above, because the circuit board provided by the present invention is manufactured through the same process and then cut so as to be applied in notebook computers with different sizes, compared with the conventional arts, the manufacturing cost of the circuit board provided by the present invention is lower and the manufacturing process is simpler. Since the circuit board provided by the present invention is cut to be disposed in the mainframes of the notebook computers with different sizes, compared with the conventional arts, the circuit board provided by the present invention is not required to be electrically connected to the medium circuit board. Accordingly, the circuit board provided by the present invention does not occupy more internal space of the mainframes, and the signal transmitted by the connectors of the circuit board provided by the present invention has a preferable quality.

In order to the make aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
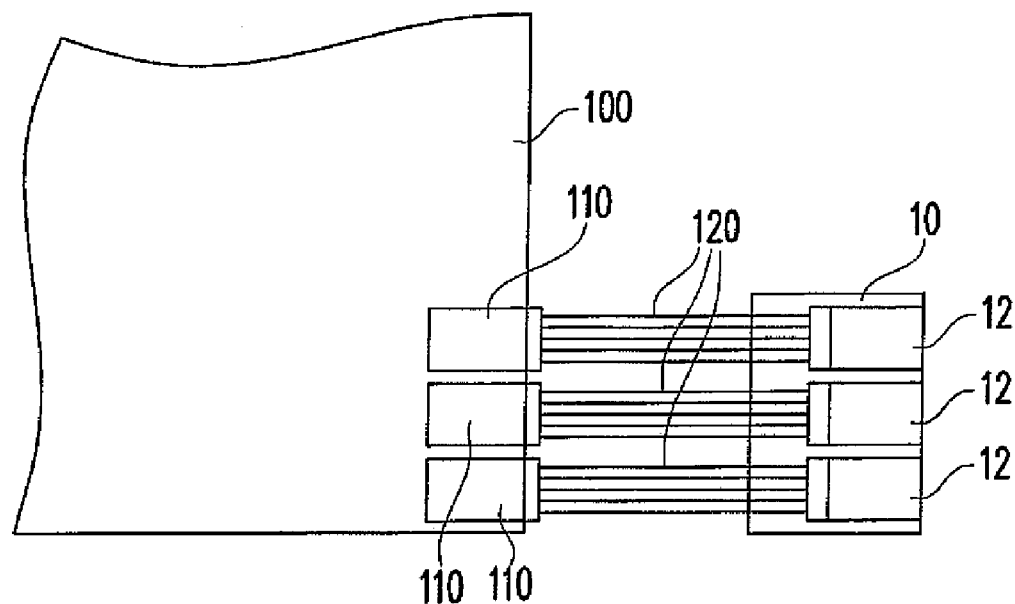
FIG. 1 is a schematic view of a conventional mainboard.
Figure 2:
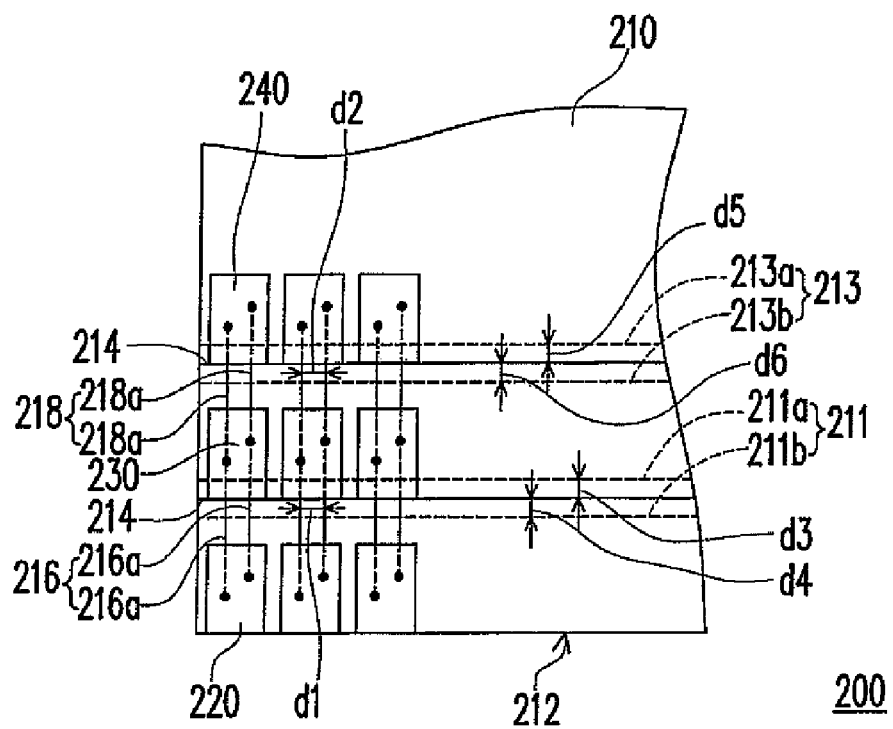
FIG. 2 is a schematic view of a circuit board according to an embodiment of the present invention.

FIG. 2 is a schematic view of a circuit board according to an embodiment of the present invention. Referring to FIG. 2, the circuit board 200 of this embodiment is, for example, a mainboard, and includes a board body 210, at least one first connector 220 (three first connectors 220 schematically shown in FIG. 2), and at least one second connector 230 (three second connectors 230 schematically shown in FIG. 2). The board body 210 has an edge 212 and at least one auxiliary scribed line 214 (two auxiliary scribed lines 214 schematically shown in FIG. 2), and the auxiliary scribed lines 214 are substantially parallel to the edge 212. Furthermore, the circuit board 200 of this embodiment further comprises at least one third connector 240 (three third connectors 240 schematically shown in FIG. 2).

The first connectors 220 are disposed on the board body 210 and adjacent to the edge 212, the second connectors 230 are disposed on the board body 210 and adjacent to one of the auxiliary scribed lines 214, and the third connectors 240 are disposed on the board body 210 and adjacent to another of the auxiliary scribed lines 214. In other words, the first connectors 220 are arranged along the edge 212, the second connectors 230 are arranged along the auxiliary scribed line 214 near the edge 212, and the third connectors 240 are arranged along the auxiliary scribed line 214 away from the edge 212. The second connectors 230 are electrically connected to the first connectors 220 respectively. The first connectors 220 are disposed on one side of the auxiliary scribed line 214 near the edge 212 and the second connectors 230 are disposed on the other side of the auxiliary scribed line 214 near the edge 212. Furthermore, the third connectors 240 are electrically connected to the second connectors 230 s respectively. The second connectors 230 are disposed on one side of the auxiliary scribed line 214 away from the edge 212 and the third connectors 240 are disposed on the other side of the auxiliary scribed line 214 away from the edge 212.

It should be noted that the circuit board 200 of this embodiment is applicable to the notebook computers having 17-inch, 15-inch, or 14-inch displays. The circuit board 200 of this embodiment may be directly applied in the notebook computer with a 17-inch display. If the circuit board 200 of this embodiment is applied in the notebook computer with a 15-inch display, the circuit board 200 is cut with reference to the auxiliary scribed line 214 near the edge 212. In this way, if the circuit board 200 in this embodiment is applied in the notebook computer with a 14-inch display, the circuit board 200 is cut with reference to the auxiliary scribed line 214 away from the edge 212. Therefore, the circuit board 200 in this embodiment may be applied in the notebook computers with different sizes.

In this embodiment, the board body 210 may have a plurality of first connection circuits 216 and a plurality of second connection circuits 218. Each of the first connection circuits 216 has a plurality of first connection wires 216a (two first connection wires 216a schematically shown in FIG. 2), and each of the second connection circuits 218 has a plurality of second connection wires 218a (two second connection wires 218a schematically shown in FIG. 2). Each of the second connectors 230 is correspondingly electrically connected to one of the first connectors 220 through the first connection wires 216a of one of the first connection circuits 216. Each of the third connectors 240 is correspondingly electrically connected to one of the second connectors 230 through the second connection wires 218a of one of the second connection circuits 218.

It should be noted that the first connectors 220, the second connectors 230, and the third connectors 240 in this embodiment may be suitable for connecting peripheral equipments, such as a mouse, a display, a keyboard, a printer, or a plotter. It should be emphasized that as for the relative positions as shown in FIG. 2, if the first connectors 220 are suitable for connecting the mouse, the keyboard, and the printer from left to right the second connectors 230 and the third connectors 240 are also suitable for connecting the mouse, the keyboard, and the printer from left to right. In other words, one of the first connectors 220, one of the second connectors 230, and one of the third connectors 240 which are correspondingly electrically connected are suitable for being connected to the same peripheral equipment.

Figure 3:
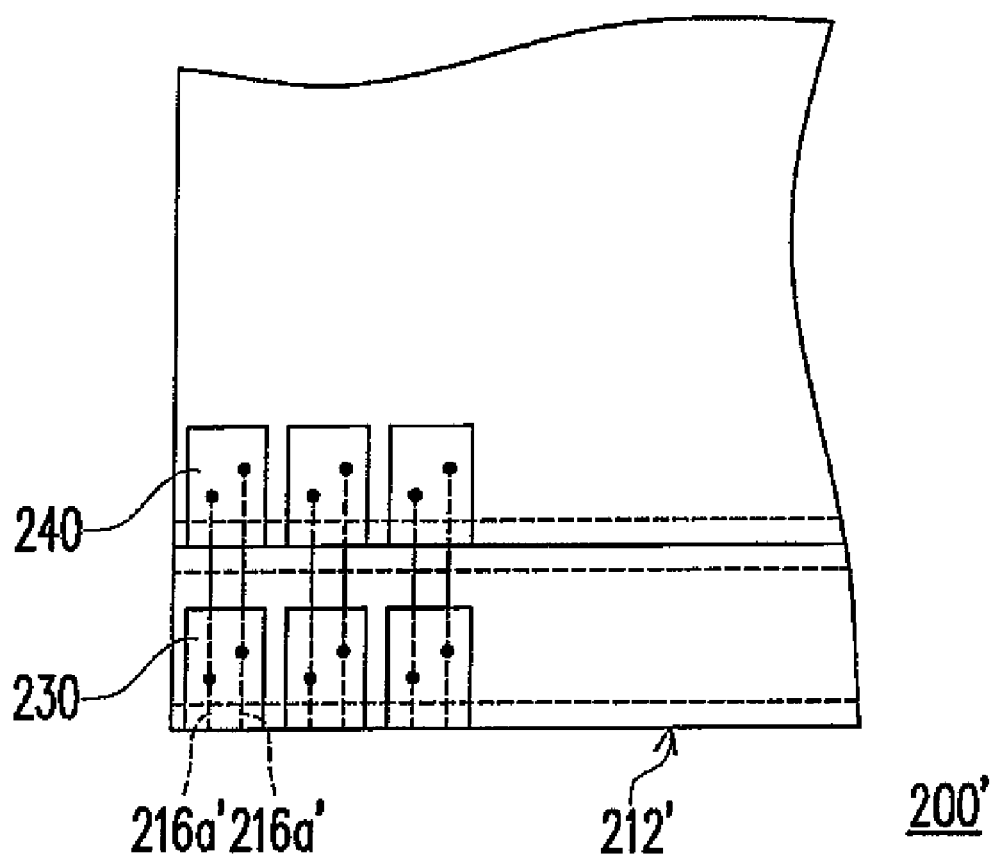
FIG. 3 is a schematic view of the circuit board in FIG. 2 after being cut.

In this embodiment, the interval d1 between every adjacent two of the first connection wires 216a may be larger than or equal to 1 mm, and the interval d2 between every adjacent two of the second connection wires 218a may be larger than or equal to 1 mm. The intervals d1 and d2 prevent the short of the adjacent first connection wires 216a or the adjacent second connection wires 218a of the circuit board 200 after being cut. Referring to FIGS. 2 and 3, FIG. 3 is a schematic view of the circuit board of FIG. 2 after being cut. For example, after the circuit board 200 is cut with reference to the auxiliary scribed line 214 near the edge 212, the first connection wires 216a are also cut and a new edge 212' of the cut circuit board 200' is substantially the auxiliary scribed line 214 of the original circuit board 200 near the edge 212. Since the interval d1 between every adjacent two of the first connection wires 216a is larger than or equal to 1 mm, the adjacent cut first connection wires 216a' at the new edge 212' of the cut circuit board 200' may not contact one another to cause the short circuit.

Referring to FIG. 2 again, the board body 210 of this embodiment may have a first single wiring layer area 211 and a second single wiring layer area 213. Two opposite borders 211a and 211b of the first single wiring layer area 211 maintain two intervals d3, d4 with the auxiliary scribed line 214 near the edge 212 respectively, such that the first single wiring layer area 211 covers the auxiliary scribed line 214 near the edge 212. Two opposite borders 213a and 213b of the second single wiring layer area 213 maintain two intervals d5, d6 with the auxiliary scribed line 214 away from the edge 212 respectively, such that the second single wiring layer area 213 covers the auxiliary scribed line 214 away from the edge 212. Furthermore, the intervals d3, d4, d5, d6 may be larger than or equal to 3 mm and less than or equal to 4 mm.

In the range covered by the first single wiring layer area 211, the wiring layer where the first connection circuits 216 are located is a single wiring layer of the board body 210. The first connection circuits 216 may be disposed on the surface of or inside the board body 210 according to the requirements of the designers. In this way, in the range covered by the second single wiring layer area 213, the wiring layer where the second connection circuits 218 are located is a single wiring layer of the board body 210. The second connection circuits 218 may be disposed on the surface of or inside the board body 210 according to the requirements of the designers.

Referring to FIGS. 2 and 3, it should be noted that after the circuit board 200 is cut with reference to the auxiliary scribed line 214 near the edge 212, since the wiring layer where the first connection circuits 216 are located is a single wiring layer, the cut connection wires 216a' at the new edge 212' of the cut circuit board 200' may not contact other wiring layers to cause the short circuit.

In view of the above, the circuit board provided by the present invention has at least the following advantages.

1. Since the circuit board provided by the present invention is manufactured through the same process and then cut to be applied in notebook computers with different sizes, compared with the prior arts, the manufacturing cost of the circuit board provided by the present invention is lower and the manufacturing process is simpler.

2. Since the circuit board provided by the present invention is cut to be disposed in the mainframes of the notebook computers with different sizes, compared with the prior arts, the circuit board provided by the present invention is not required to be electrically connected to the medium circuit board. Accordingly, the circuit board provided by the present invention does not occupy more internal space of the mainframes.

3. Since the circuit board provided by the present invention is cut to be disposed in the mainframes of the notebook computers with different sizes, compared with the prior arts, the circuit board provided by the present invention is not required to be electrically connected to the medium circuit board. Accordingly, the signal transmitted by the connectors of the circuit board provided by the present invention has a preferable quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board, comprising:
   a board body, having a connection circuit, an edge and at least one auxiliary scribed line, wherein the auxiliary scribed line is substantially parallel to the edge, the connection circuit has a plurality of connection wires and the interval between every adjacent two of the connection wires is larger than or equal to 1 mm;
   at least one first connector, disposed on the board body and adjacent to the edge; and
   at least one second connector, disposed on the board body and adjacent to the auxiliary scribed line, wherein the second connector is electrically connected to the first connector through the connection circuit and the first connector and the second connector are located on different sides of the auxiliary scribed line.

2. The circuit board as claimed in claim 1 wherein the board body has at least one area in which the board body has only one wiring layer having the connection circuit, and two opposite borders of the area maintain a first interval and a second interval with the auxiliary scribed line respectively, such that the area covers the auxiliary scribed line.

3. The circuit board as claimed in claim 2, wherein the first interval is larger than or equal to 3 mm and less than or equal to 4 mm.

4. The circuit board as claimed in claim 2, wherein the second interval is larger than or equal to 3 mm and less than or equal to 4 mm.

* * * * *